United States Patent [19]

Bridgewater

[11] 3,743,944

[45] July 3, 1973

[54] AUTOMATIC TUNING CONTROL CIRCUITS

[76] Inventor: Thomas Austin Bridgewater, Indianapolis, Ind.

[73] Assignee: RCA Corporation, New York, N.Y.

[22] Filed: May 17, 1971

[21] Appl. No.: 143,858

[52] U.S. Cl. .................................. 325/471, 325/418

[51] Int. Cl. .............................................. H04b 1/32

[58] Field of Search.................... 325/420, 422, 453, 325/454, 455, 456, 457, 459, 464, 469, 470, 471; 334/15; 313/16; 178/DIG. 15

[56] References Cited

UNITED STATES PATENTS

| | | | |
|---|---|---|---|
| 3,632,864 | 1/1972 | Evans | 325/471 X |
| 3,581,252 | 5/1971 | Sacher | 334/15 |
| 3,652,960 | 3/1972 | Sakamoto | 325/455 X |
| 3,467,873 | 9/1969 | Buhr | 325/471 |
| 3,467,872 | 9/1969 | Kasuga | 325/471 |
| 3,528,043 | 9/1970 | Richter | 334/15 X |
| 3,597,531 | 8/1971 | Marinis | 325/471 X |
| 3,631,349 | 12/1971 | Rhee | 334/15 X |

*Primary Examiner*—Benedict V. Safourek
*Attorney*—Eugene M. Whitacre

[57] ABSTRACT

A system is described for automatically controlling the tuning of a television receiver employing a tuner which uses variable reactance devices to afford frequency selectivity. Since such variable reactance devices are voltage responsive, the system provides a plurality of control voltages to enable tuning over different frequency bands and to different channels within each band. A printed circuit switch including a plurality of contacts, fabricated as an integral assembly, are driven by a bidirectional motor to afford rapid tuning operation. The motor, in turn, is driven by a motor control circuit which is responsive to the motor position to determine when the motor accesses a preselected channel, to then stop the motor at that location. A series of indicator lamps coupled to the switches indicate the channel selected.

The system circuits also apply an automatic frequency control (AFC) voltage to the tuning system to assure quality reception. This AFC voltage is disabled during certain operating procedures to assure that the desired station will in fact be accessed.

8 Claims, 10 Drawing Figures

INVENTOR.
THOMAS AUSTIN BRIDGEWATER
BY
ATTORNEY

INVENTOR.
THOMAS AUSTIN BRIDGEWATER
BY
[signature]
ATTORNEY

PATENTED JUL 3 1973

3,743,944

SHEET 3 OF 9

INVENTOR.
THOMAS AUSTIN BRIDGEWATER
BY
ATTORNEY

INVENTOR.
THOMAS AUSTIN BRIDGEWATER
BY
[signature]
ATTORNEY

INVENTOR.
THOMAS AUSTIN BRIDGEWATER
BY
ATTORNEY

INVENTOR.
THOMAS AUSTIN BRIDGEWATER
BY
ATTORNEY

INVENTOR.
THOMAS AUSTIN BRIDGEWATER
BY
[signature]
ATTORNEY

INVENTOR.
THOMAS AUSTIN BRIDGEWATER
BY
ATTORNEY

INVENTOR.
THOMAS AUSTIN BRIDGEWATER
BY [signature]
ATTORNEY

AUTOMATIC TUNING CONTROL CIRCUITS

This invention relates to tuning systems for television receivers and, more particularly, to an automatic electronic tuning system.

The tuning of a television receiver has become increasingly more complex because of various reasons. One reason is that the consumer desires to have a receiver which responds to the conventional VHF channels and which will also respond to the UHF channels.

As known, the UHF band includes channels 14–83. Depending on the location of the receiver, a consumer might have available to him a certain number of VHF channels and a certain number of UHF channels. It is evident that he would desire to have access to all these available channels.

Because of the frequency band determinative of the UHF channels, many conventional UHF tuning devices are difficult to operate. Furthermore, because of present federal regulations, it is desirable to have parity of tuning throughout all the channels of the television spectrum. These of course include both VHF and UHF. The parity of tuning concept requires that the consumer tune UHF and VHF in the same manner with the same convenience and have access to at least a sufficient number of television channels which might be transmitting.

It is also desirable to operate the tuning mechanism by means of a remote control unit. As is well known, such remote control units enable the consumer to tune the receiver from a remote location without accessing any controls on the front panel.

The prior art shows a plurality of techniques for performing remote tuning using stepping motors, switches and so on. Many of these techniques operate in conjunction with the so-called mechanically detented tuners. Presently, there exist VHF and UHF tuners for television receivers which are electronic in nature. These tuners do not use mechanical detents but use switching diodes and variable reactance devices subjected to variable control voltages to enable tuning of VHF and UHF bands. Such davices eliminate a great many moving parts normally associated with tuners, and hence offer greater reliability.

However, in utilizing such devices care has to be taken in controlling the voltages applied to such devices to assure that the desired channel will be tuned to.

Accordingly, one feature of the present invention describes apparatus for providing stabilized voltages for controlling the switching diodes and varactor diodes included in such apparatus.

Another aspect of this invention describes apparatus for disabling automatic frequency control circuitry when the television receiver is turned-on and until the power supplies and therefore such voltages have stabilized.

Another feature of this invention is to provide a television receiver with electronic tuning wherein a plurality of preselected channels can be automatically tuned to and indicated without employing conventional detent switches.

A further feature discloses apparatus which enables one to preselect a predetermined number of the total number of television channels in both the UHF and VHF bands, which predetermined number may include any different combination of such channels.

Still another feature of this invention is to provide apparatus for skipping any desired channel or channels during the automatic tuning process to enable the rapid access of those channels which have been preselected.

A further aspect of this invention includes a unique printed circuit switch, which is motor driven, for controlling the automatic tuning circuitry to enable selection of said predetermined number of channels.

These and other features of the present invention are accomplished by employing a motor capable of bidirectional operation and under control of a motor control circuit, which energizes the windings of said motor for operation in either direction. The motor control circuit upon receipt of a suitable signal will also operate to stop the motor at anyone of a plurality of positions. The exact positions are determined by a printed circuit switch coupled to and operated by the motor assembly including a plurality of switch sections. One switch section is utilized for motor control; a further section is associated with a plurality of potentiometers, each one of which is set to provide a control voltage for an electronically variable tuner. These potentiometers are switched in circuit by means of the motor controlled switch to control the tuner's frequency. A plurality of indicator devices are also operated by the switch and provide an indication as to the frequency selected.

Apparatus is included to provide a stabilized voltage as well as an automatic frequency control voltage for the potentiometers and necessary to assure correct tuning.

Circuitry includes means for detecting the absence of the control voltage source to disable the automatic frequency control circuitry for assuring that the system will remain tuned to the correct frequency after the source has stabilized.

Further apparatus includes means for bypassing a particular position to enable rapid tuning of the system and eliminating a stoppage of the system at a frequency which is not associated with an active station.

Other features including proper band selection levels and coarse indicating means are also provided.

These and other aspects of the present invention will be explained with reference to the following specification when read in conjunction with the accompanying drawings in which.

Figure 5:
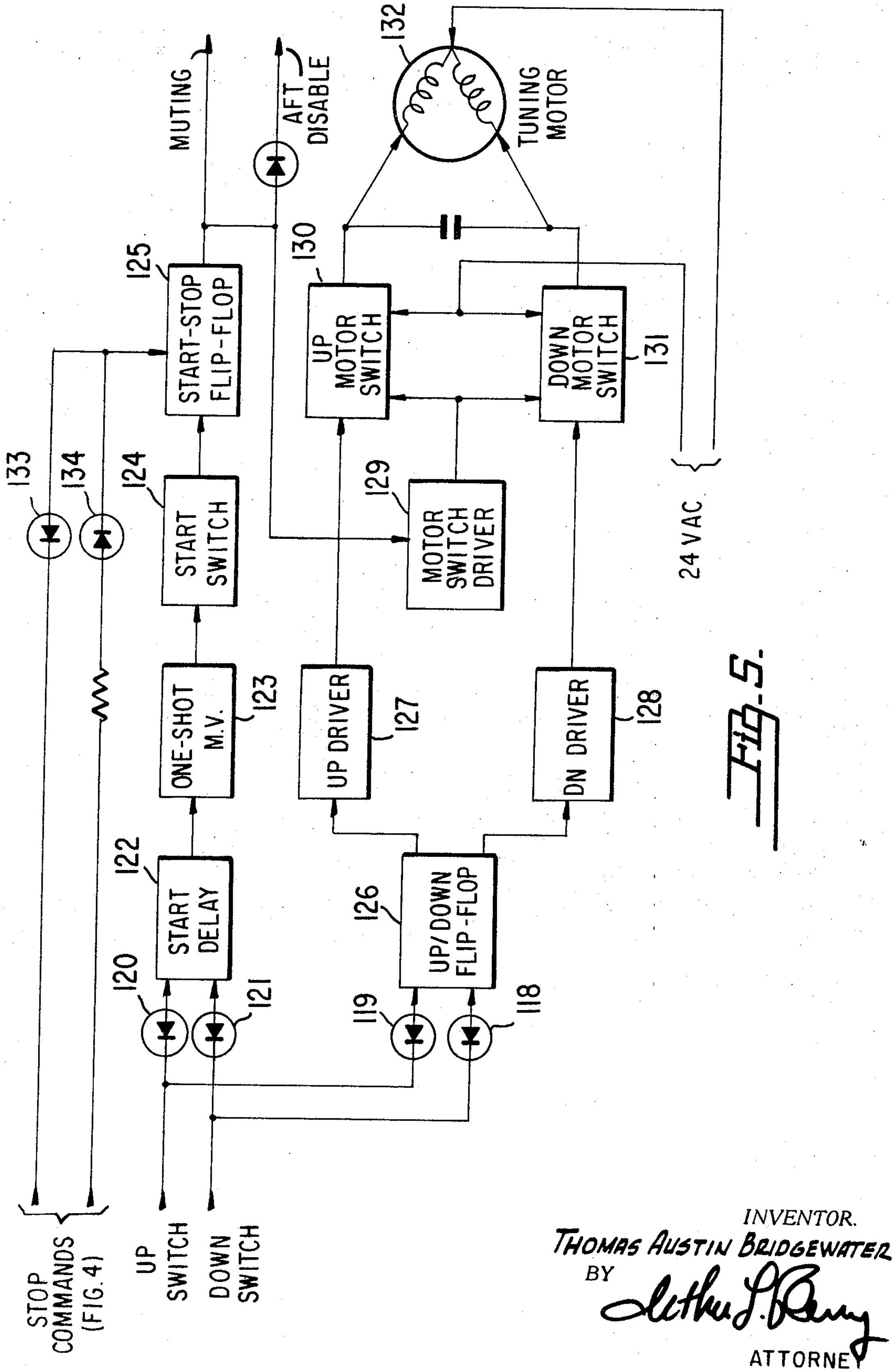
FIG. 5 is a detailed block diagram of the motor control circuitry.
Figure 6A:
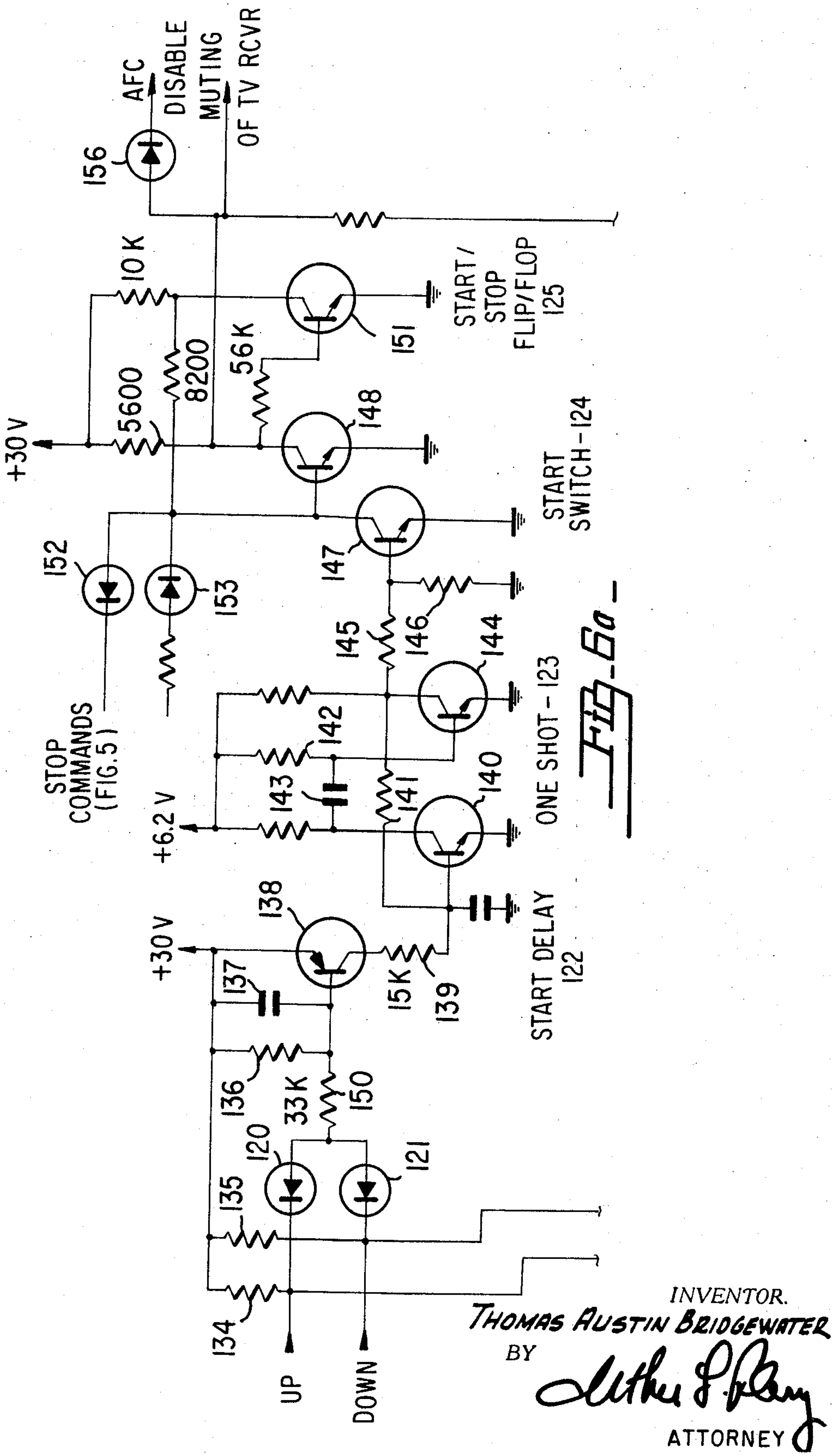
Figure 6B:
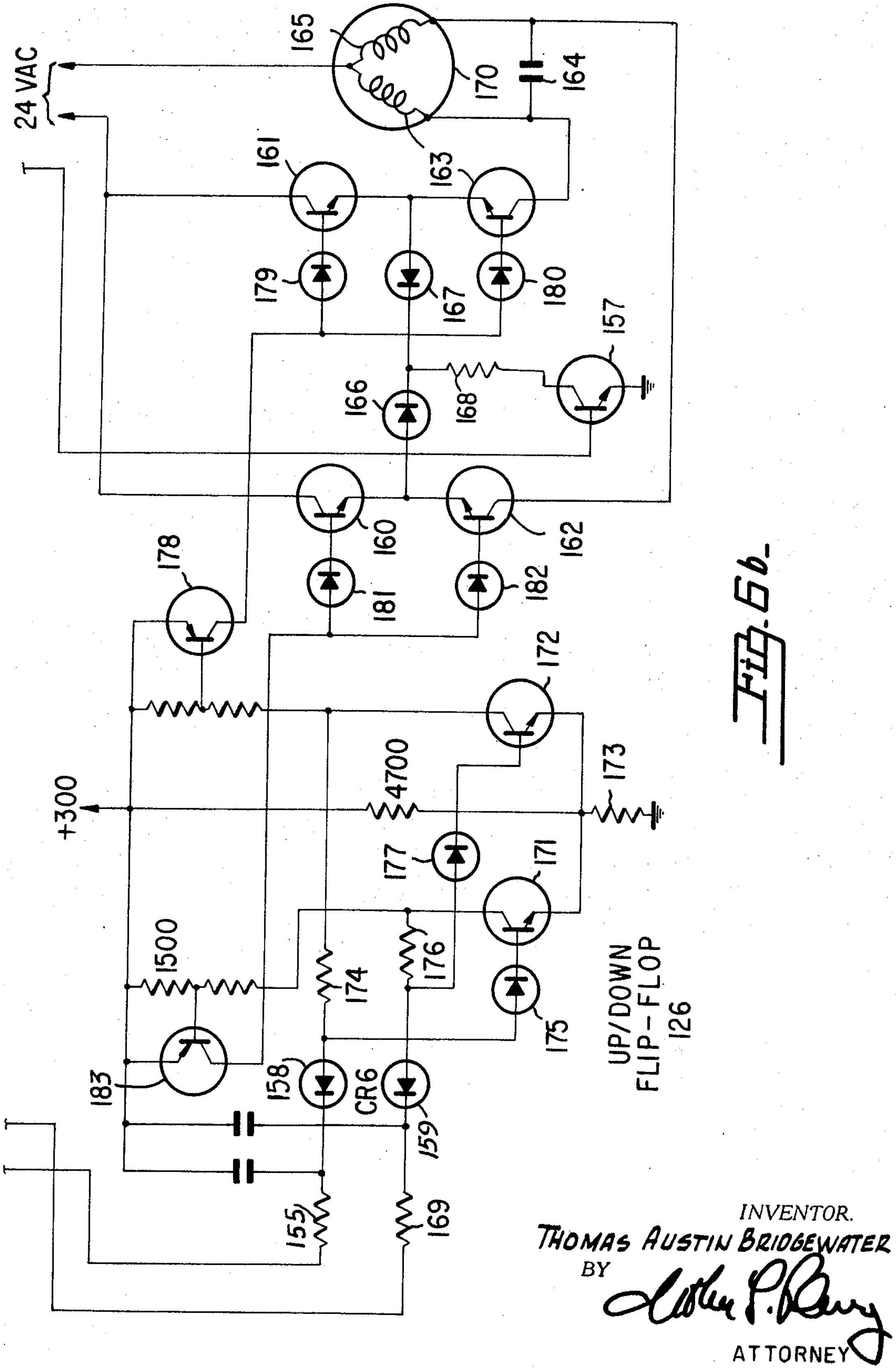
Figures 7, 7A, 7B:
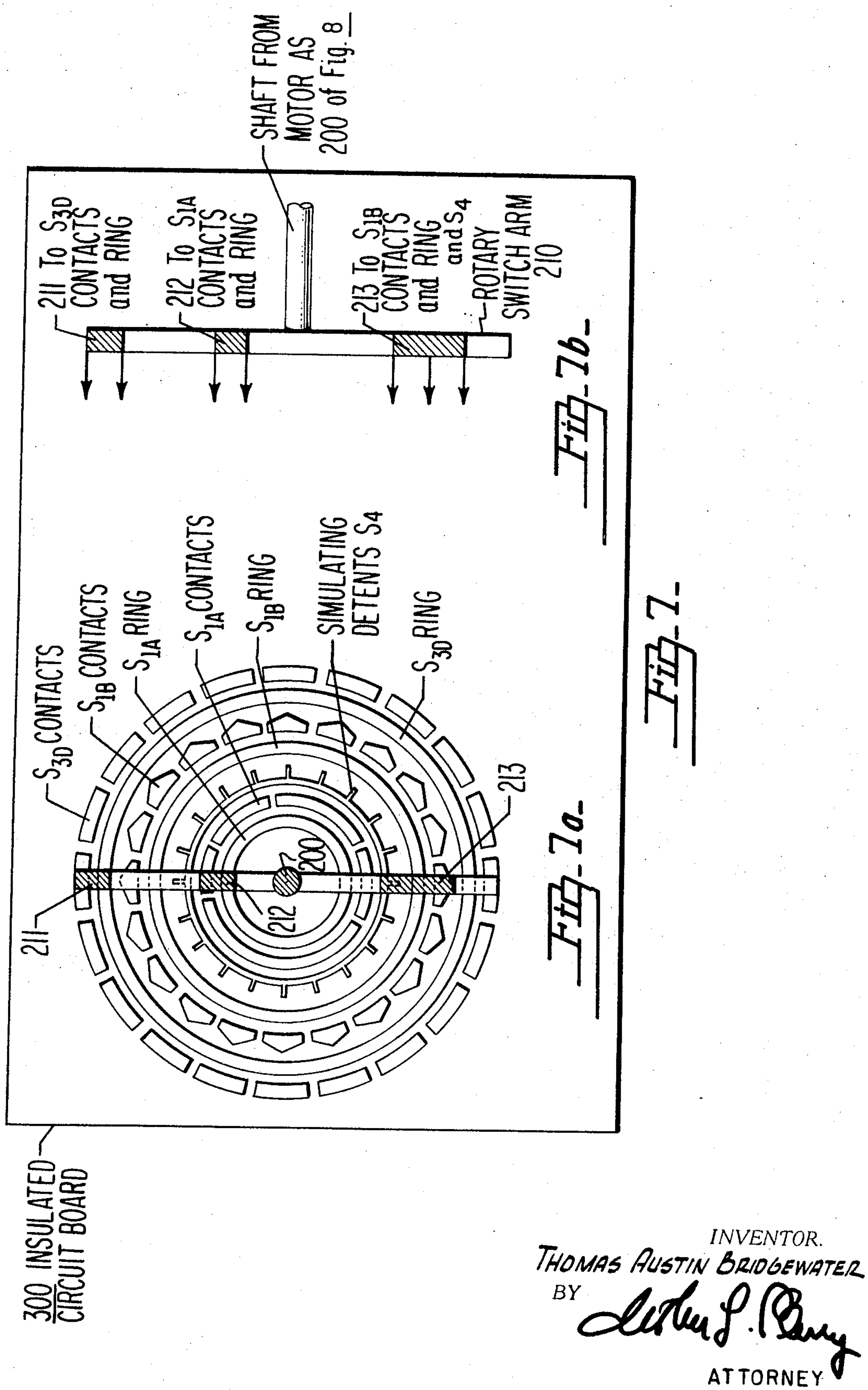
Figure 8:
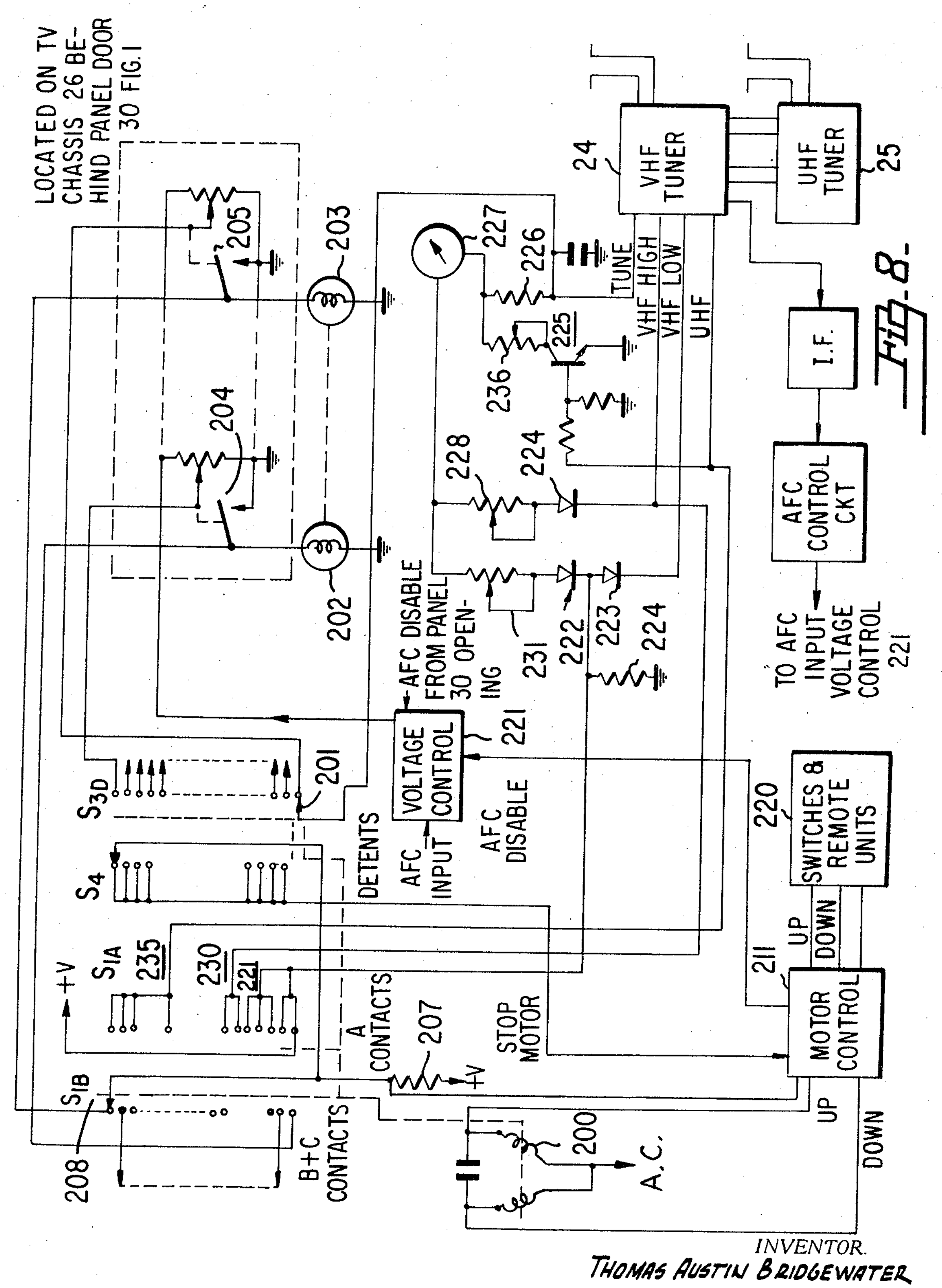

FIGS. 6*a* and 6*b* are schematic diagrams of the circuitry included in FIG. 5;

FIG. 7A is a plan view of a printed circuit switch assembly;

FIG. 7B is a side elevational view of a motor driven rotary switch arm used in conjunction with the switch of FIG. 7A;

FIG. 8 is a detailed schematic diagram partly in block form of the control system including switch operation according to this invention.

Figure 1:
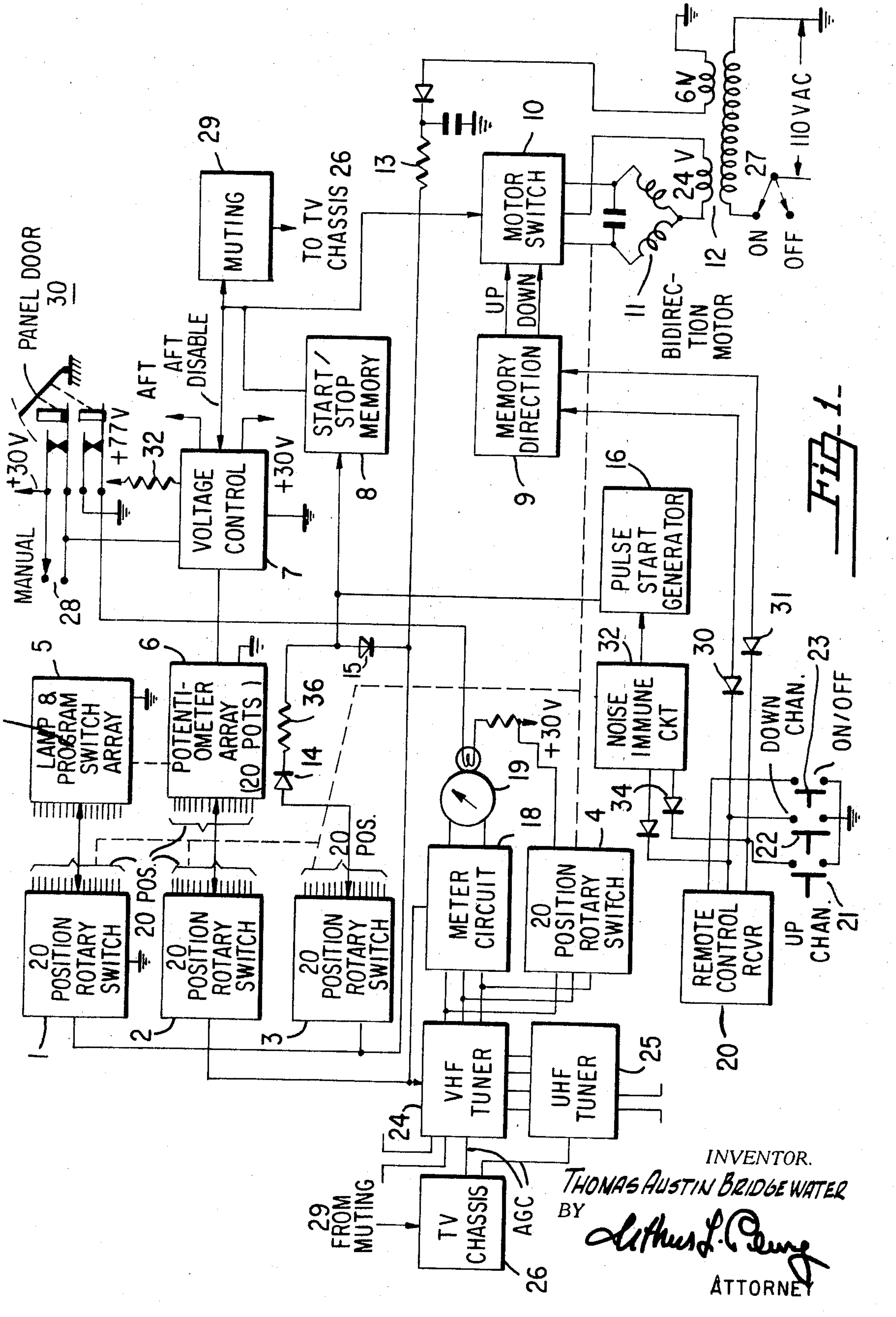
FIG. 1 is a block diagram of automatic tuning control apparatus according to this invention.

Referring to FIG. 1, there is shown a bidirectional motor 11. Motor 11 has associated therewith a rotor which drives a shaft, not shown. The shaft is mechanically coupled to a plurality of 20 position rotary switches designated as 1, 2, 3 and 4 respectively. The motor 11 is operated in either of two directions as forward or reverse or up and down under the control of a direction memory circuit 9 and a motor switch circuit 10.

Briefly, the motor is activated in the forward or up direction by means of an up channel switch 21, which has one terminal coupled to the direction memory circuit 9 via an isolating diode 31.

Similarly, the motor may be operated in the reverse direction or the down direction by means of the down channel switch 22 which is coupled to the direction memory 9 via an isolating diode 30.

Also shown coupled to the diodes 30 and 31 is a remote control receiver 20. Remote control receiver 20 is a typical remote unit which is responsive to the reception of ultrasonic or other propagated signals to thereby remotely activate the motor 11 independent of the switches 21 and 22.

As is seen from FIG. 1, two appropriate outputs of the remote control receiver 20 are connected respectively to the diodes 30 and 31 to indicate that the motor 11 may also be controlled by means of the remote control receiver 20. Upon activating either the remote control functions or, for example, the switch 21, the memory direction circuit 9, which may comprise a bistable multivibrator, is set in one of its two states. The states are represented by the two output leads from the memory direction 9 labeled respectively as the "up" and "down" leads.

As soon as the switch 21 is depressed, the direction memory 9 is set to the desired state. The closure of the switch serves to activate a noise immune circuit 32 which has its input coupled to the appropriate switch terminal via a diode 34. The noise immune circuit thus shown may consist of a monostable multivibrator or an R-C network having a predetermined specified time delay. The purpose of the noise immune circuit is to ignore or integrate noise and to discriminate against "switch bounce" which conditions may otherwise activate the circuitry even though the switch or the remote control function has not been accessed.

After the noise immune circuit 32 has been appropriately activated, it will trigger a start pulse generator 16 which is a monostable multivibrator or a Schmitt trigger. The start pulse generator 16 after the delay through the noise immune circuit 32 thereby provides a fixed duration pulse at its output. This pulse serves to activate the start-stop memory module 8. The start-stop memory module 8 may also comprise a bistable multivibrator having two stable states designated respectively as the "start" and "stop" states.

Therefore, the activation of switch 21 serves to set the direction memory 9 and the start-stop memory 8 to appropriate states. The particular states for the activation of the up channel switch 21 are the up channel state for the direction memory 9 and the start or run state for memory 8. This combination of conditions causes the motor switch 10 to activate the proper winding of motor 11 due to the suitable voltages applied.

Operation of the motor 11 controls the rotary switches 1, 2, 3 and 4 which, as will be explained, controlthe electronically control the VHF tuner 24 and the UHF tuner 25 to enable channel selection.

Additionally, the start-stop memory 8 is also coupled to a muting module 29 and a voltage control module 7. The muting module 29 is responsive to the start or run state of memory 8 to apply a muting signal to the TV chassis 26, This muting signal will disable the sound channel of the receiver and blank the video display to thereby eliminate sound transients and picture transients from appearing on the screen of a kinescope associated with the receiver during the motor control cycle.

The voltage control circuit 7 responds to the start signal to provide at its output a constant voltage as long as the motor 11 remains energized. Initially, all desired television channels are preset in the receiver by means of the potentiometers in module 6. The motor 11 typically runs through multiples of 18°, which enables one to select 20 channels or 20 positions during a 360° rotation.

As soon as the motor 11 sets the apparatus to a position representative of a preselected channel, the following operations occur.

At the position representing a preselected channel, the 20 position rotary switch 3 is programmed to supply a positive voltage to the start-stop memory 8. This voltage is applied via diode 14 in series with a resistor 36 coupled between the 20 positions switch 3 and the start-stop memory 8.

The preselected channel. voltage is also applied to the and lamp and program switch array 5 via 20 position rotary switch 1 to thereby illuminate an indicator corresponding to the preselected channel, The control voltage for the potentiometers contained in module 6 is supplied from the voltage control circuit 7. The positive voltage applied to the start-stop memory 8 via switch 3 serves to reset the same to thereby cause a transition from the start or run state to the stop state. This, in turn, causes the motor switch 10 to inactivate the bidirectional motor 11. Therefore, for the preselected channel condition, as described above, that channel will be selected automatically and thence serve to de-energize the motor.

If one desires the motor to bypass or skip a particular channel, this condition may be programmed into the apparatus as follows.

As briefly indicated, lamp and program switch array 5 includes a plurality of lamps and switch contacts (20 of each), each one corresponding to a different channel to be selected. If a channel is not desired, an appropriate lamp in module 5 is shorted out. The short-circuited lamp provides a low impedance through the diode 15 via switch 1. This low impedance prevents a stop control voltage from being applied to the start-stop memory 8, thus permitting the motor 11 to continue operating. As soon as the motor controlled switches are in a position in which a channel has been preselected, the motor stops.

When the motor 11 has stopped, the entire system circuitry assumes its quiescent state. The disable or muting signals are removed from the TV chassis 26, thus permitting audio and picture to reappear. The AFC disable lead also is inactivated to permit a suitable control voltage to be developed by module 7 to thereby control varactor diodes associated with the electronic tuner assemblies 24 and 25.

During this quiescent state the following conditions exist. A lamp contained in module 5 is illuminated, thus indicating the channel selected. A potentiometer contained in module 6 is switched in the circuit. At this time the meter 19 will indicate a level determined by the setting of the potentiometer contained in module 6. If the potentiometer setting is varied, the meter will vary accordingly, coarsely indicating the channel which is being selected. The voltage obtained across the potentiometer in module 6 is also applied to the appropriate tuner module 24 or 25 via switch 2. Depending upon the tuner (VHF or UHF) that is receiving B+ which is determined by switch 4, this voltage serves to change the reactance of a variable reactance device associated with that tuner to thereby permit the tuner to respond to the desired channel.

In summation, the operation of the automatic tuning control system is as follows. Each of the 20 positions available has a potentiometer associated therewith. Each potentiometer may be preset to a predetermined channel, which channel will be indicated by the meter scale. The potentiometers are accessed through a panel 30 located on a suitable surface of the television receiver. The opening of the panel 30 to gain access to the potentiometer array 6 is accompanied by operation of the switch 28. This serves to disable the receiver's automatic frequency control circuit to thereby cause the voltage control circuit 7 to supply a constant voltage to the potentiometer array 6. This constant voltage then permits the operator to tune to the desired channel without interference from the automatic frequency control circuit.

Figure 2:
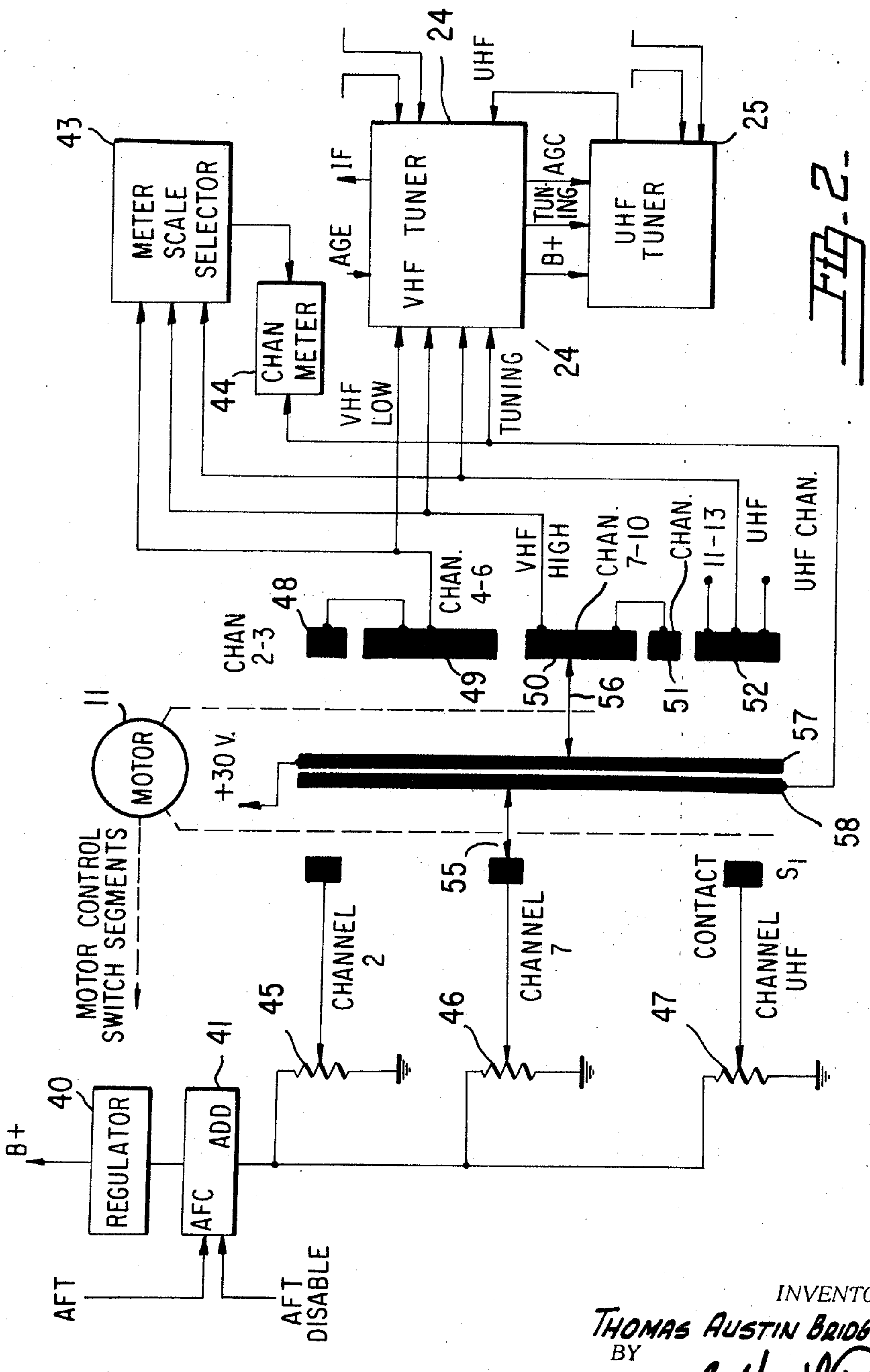
FIG. 2 is a simplified block diagram of band switching and tuning control circuitry according to this invention.

Referring to FIG. 2, there is shown the VHF tuner 24 and the UHF tuner 25. These tuners are electronic in nature and utilize variable reactance devices, such as varactor diodes, to afford tuning within the desired television bands. The television band is selected by means of control voltages which activate switching diodes associated with these tuners for supplying band selection. For an example of a suitable UHF tuner, reference is made to a patent application entitled "ELECTRONICALLY TUNED ULTRA HIGH FREQUENCY TELEVISION TUNER", filed on Mar. 23, 1970, Ser. No. 21,563 for David John Carlson and assigned to the RCA Corporation.

For an example of a VHF tuner employing switching diodes and control, reference is made to Ser. No. 829,335 entitled "ELECTRONIC SWITCHING OF TUNED CIRCUITS", filed on June 2, 1969, for George William Carter and assigned to RCA Corporation.

Many other examples of diode switched and variable reactance tuned devices are also available and known in the art.

The VHF band is conventionally broken up into two bands, one band being the low VHF band, and the other being the high VHF band. Conventionally, the low VHF band contains channels 2–6, while the high VHF band contains channels 7–13. The UHF band contains all the UHF channels as 14–83.

In the control system shown in FIG. 1, it is seen that at least two fairly distinct operations are required to select a channel. First, the appropriate band must be selected. Second, the tuner must be tuned within that band to the desired channel.

Band switching within such varactor tuners is accomplished by the application of a fixed predetermined control voltage to an appropriate input line to thereby energize switching diodes associated with that particular band of frequencies. In order to maintain tuning, it is also desirable to provide a tuning voltage and an automatic frequency control voltage to the tuning devices which are varactor diodes, as will be explained.

There is shown in FIG. 2, the motor 11 which is, as indicated, bidirectional. For the purposes of this description, it will also be assumed that the motor 11 can be started and stopped at will.

Potentiometers 45–47 are shown schematically and respectively represent, for example, channel 2, channel 7, and a desired UHF channel. As previously indicated in connection with the array 6 of FIG. 1, there are 20 potentiometers available similar in connections and functions to those shown herein and utilized to tune the receiver to at least 20 available channels.

The switch arm 55 is controlled in movement by the motor 11. In the position shown, the arm 55 connects the channel 7 potentiometer 46 to a common switch bus or "ring" 58. An additional switch contact 56, also under control of the motor, serves to connect a switch bus or ring 57 to a switch segment 50. Switch segment 50 is prewired to the VHF high band tuner bus. The 30 volt supply is then applied to this tuner bus and causes the VHF high band switching diodes to operate. This places the VHF tuner in the high band position to enable response to any channel within that band, as channels 7–13.

The potentiometer 46 is coupled via ring 58 to the tuning bus of the VHF tuner 24. The potentiometer 46 is pre-adjusted such that it supplies a voltage for the highband VHF tuner sufficient to tune the receiver to channel 7. This is done, as indicated, by varying the reactance of a suitable varactor diode. It is also noted that any potentiometer in the VHF high channel band, as those needed for channel 7 to channel 13, can be adjusted to provide reception on any channel within that band. Thus, it is desirable to provide some auxiliary means of channel indication for the initial setting of such additional potentiometers, not shown.

A channel meter or tuning meter 44 is under the control of a meter scale selector 43. The meter 44 is calibrated in channel numbers in three ranges: 2–6, 7–13 and 14–83. The exact range is determined by whatever band switch segment, as 48–52, is in circuit; and the amount of voltage supplied to ring 58 causes the meter 44 to indicate the approximate channel within that band. The meter scale selector 43 has three inputs coupled to the three tuner band switch busses and sets the meter range according to the tuner band switch bus accessed by the motor controlled switches. The exact channel, indicated, being determined by the control voltage on the tuning bus. The voltage across the potentiometer used for tuning is supplied by a regulator 40, which provides a constant voltage needed for accurate tuning. A further circuit 41, as will be described, serves to superimpose an automatic frequency control voltage on this regulated level, to accurately control the tuning.

Figure 3:
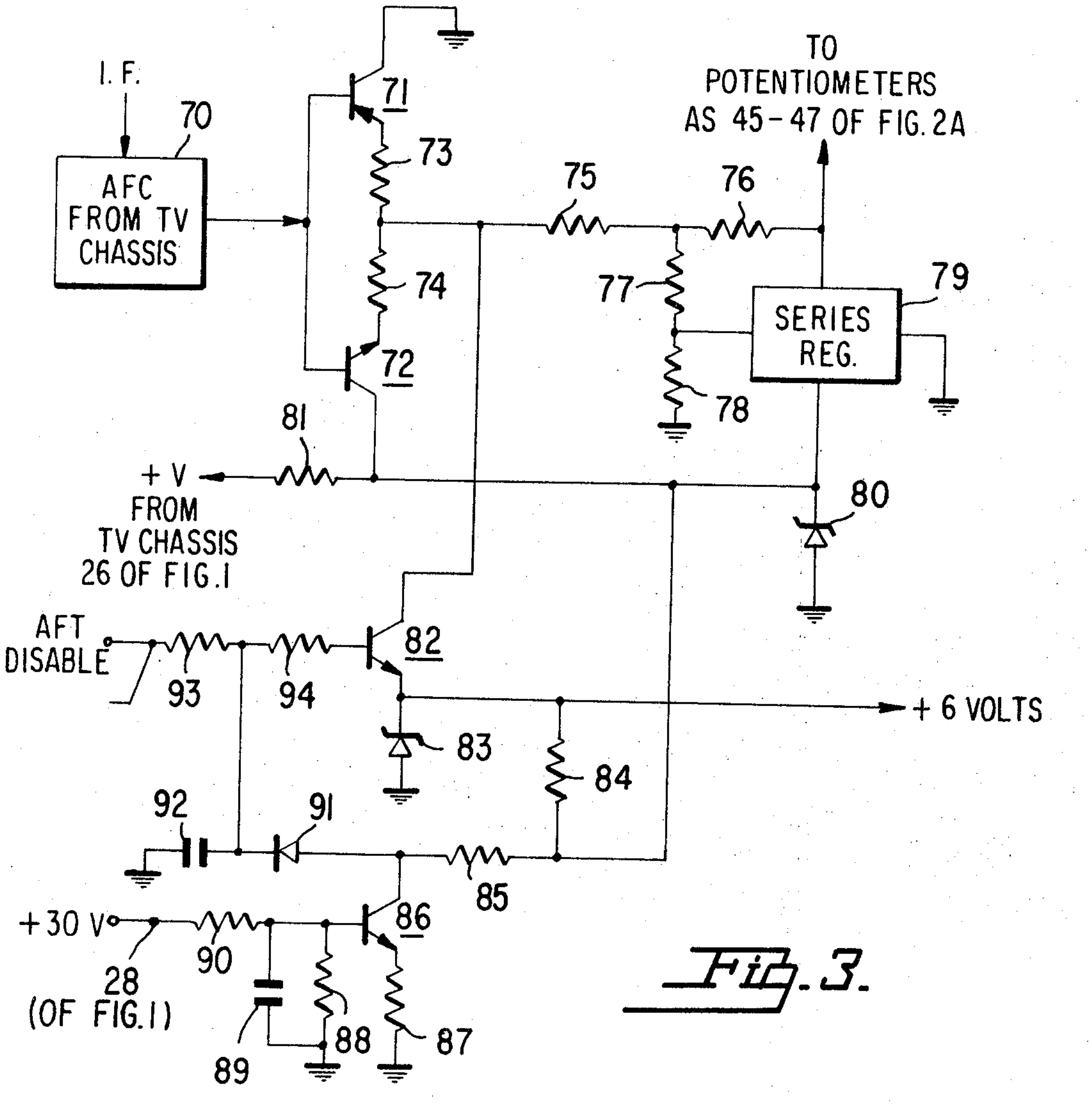
FIG. 3 is a schematic diagram partially in blockform showing the voltage control circuitry.

Referring to FIG. 3, there is shown the regulator 40 and the AFC add circuit 41 of FIG. 2. These correspond to the voltage control module 7 of FIG. 1. Basically, this voltage control module, as 7 of FIG. 1, consists of three voltage regulators, an automatic frequency control delay and switching circuit. There is also a circuit which adds the automatic frequency control voltage to the regulated supply voltage for controlling the voltage across the tuning potentiometers, as 45 to 47 of FIG. 2.

A positive voltage supply designated as +V is obtained from the television chassis 26 of FIG. 1. The +V voltage is of a large magnitude and is dropped in voltage by means of resistor 81 and the zener diode 80, thereby supplying an operating potential for the integrated circuit seriesregulator 79. Series regulators in integrated form are well known in series regulator art and are not considered part of this invention.

An example of a suitable type of regulator which may be utilized is the RCA CA3055.

The automatic frequency control voltage is also obtained from the television chassis, and such control voltage is obtained by means of the conventional discriminator circuit as 70 which operates on the IF frequency and produces the varying DC voltage depending on the deviation of the IF video carrier frequency above or below 45.75 megacycles. This varying DC voltage determinative of the above deviation is applied directly to the bases of transistors 71 and 72 which have their emitters coupled together by means of resistors 73 and 74, operating potential is supplied for this combination by coupling the collector of transistor 72 to the above-noted resistor 81, while the collector of transistor 71 is returned to ground. The automatic frequency control 70 output is obtained at the junction between resistors 73 and 74, and this DC voltage follows the AFC voltage.

The advantage of using the AFC voltage in this manner is that the junction between resistors 73 and 74 provides a relatively low impedance which can current drive the regulator. The output current from the amplifier comprising transistors 71 and 72 is applied via resistor 75 and appears across resistors 77 and 78 forming a part of the reference voltage divider for the series regulator 79. This AFC voltage is used to modulate the voltage obtained reference voltageobtained from the series regulator to provide at the output terminal of resistor 76 a DC voltage about a predetermined quiescent value. This voltage is modulated by the amplified automatic frequency control voltage. Thus the output of transistors 71 and 72 serves to current modulate the output of the regulator, and does so by adding or subtracting the necessary current through resistor 76. In this manner the automatic frequency control voltage is impressed on the supply voltage for the above-described tuning potentiometers.

In this particular system there are three instances when the AFC voltage is disabled. These are:

1. During channel changes because it is possible that the AFC voltage would "lock up" on a spurious signal if it were active;

2. The time that the tuning potentiometers are being adjusted to the desired channel; the reasons are the same which make it necessary to disable AFC while tuning a conventional tuner;

3. For a few seconds after receiver turn-on because the AFC voltage could cause the receiver to lock on the wrong channel while the various operating potentials are stabilized.

Transistor 82 and transistor 86, with their associated circuitry, provide AFC disabling at the requisite times. The input to the base electrode of transistor 82 is obtained via resistors 93 and 94. This input is derived from the motor control circuit associated with the channel selector motor and, as will be explained, goes positive whenever the motor is energized. When the voltage at the AFC disable lead goes positive, transistor 82 becomes saturated. The saturation of transistor 82 serves to clamp the junction between resistors 73 and 74 to the emitter potential of transistor 82. This potential at the emitter of transistor 82 is determined by zener diode 83. In this manner voltage at the junction of resistors 73 and 74 cannot vary and the voltage applied to the potentiometers as 45–47 of FIG. 2 remains constant as determined by the operation of the series regulator 79. A forward bias input voltage (+30 volts) to the base electrode of transistor 86 is obtained via switch 28 as shown in FIG. 1. It is recalled that when the panel door 30 is opened to access the tuning potentiometers, B+ or +30 volts is applied by means of switch 28 to the voltage control circuit. The +30 volts when applied to resistors 93 and 94 serves to saturate transistor 82, thereby again clamping the above-noted junction of resistors 73 and 74 to the zener diode 83 voltage. This then disables AFC control in the same manner as described above. It is also noted that if the +V supply is lost, the 30 volt supply may be inactivated and therefore AFC will be defeated.

During normal operation transistor 86 is poled in conduction by the 30 volts supply shown coupled to the base electrode via resistor 90. This maintains the potential at the collector electrode of transistor 86 close to ground so that transistor 82 is not turned on through diode 91. When the receiver is turned on, the 30 volt supply begins to charge capacitor 89 through resistor 90, but this requires more time than is necessary for all the television receiver chassis rating potentials to stabilize.

During this interval the collector voltage of transistor 86 is high, which serves to forward bias transistor 82 via diode 91 which is coupled to the base of transistor 82. This action thereby also defeats AFC during receiver turn-on or upon loss of the control voltage. This condition, as indicated above, is necessary since the receiver utilizes varactor controlled tuners and, as the power supplies of the receiver are stabilizing, the AFC circuit might erroneously cause the receiver to lock or tune to the wrong channel, and indicate this wrong channel by the wrong destination. This is possible due to the nature of the variable reactance devices which will vary tuning according to a DC voltage.

Figure 4:
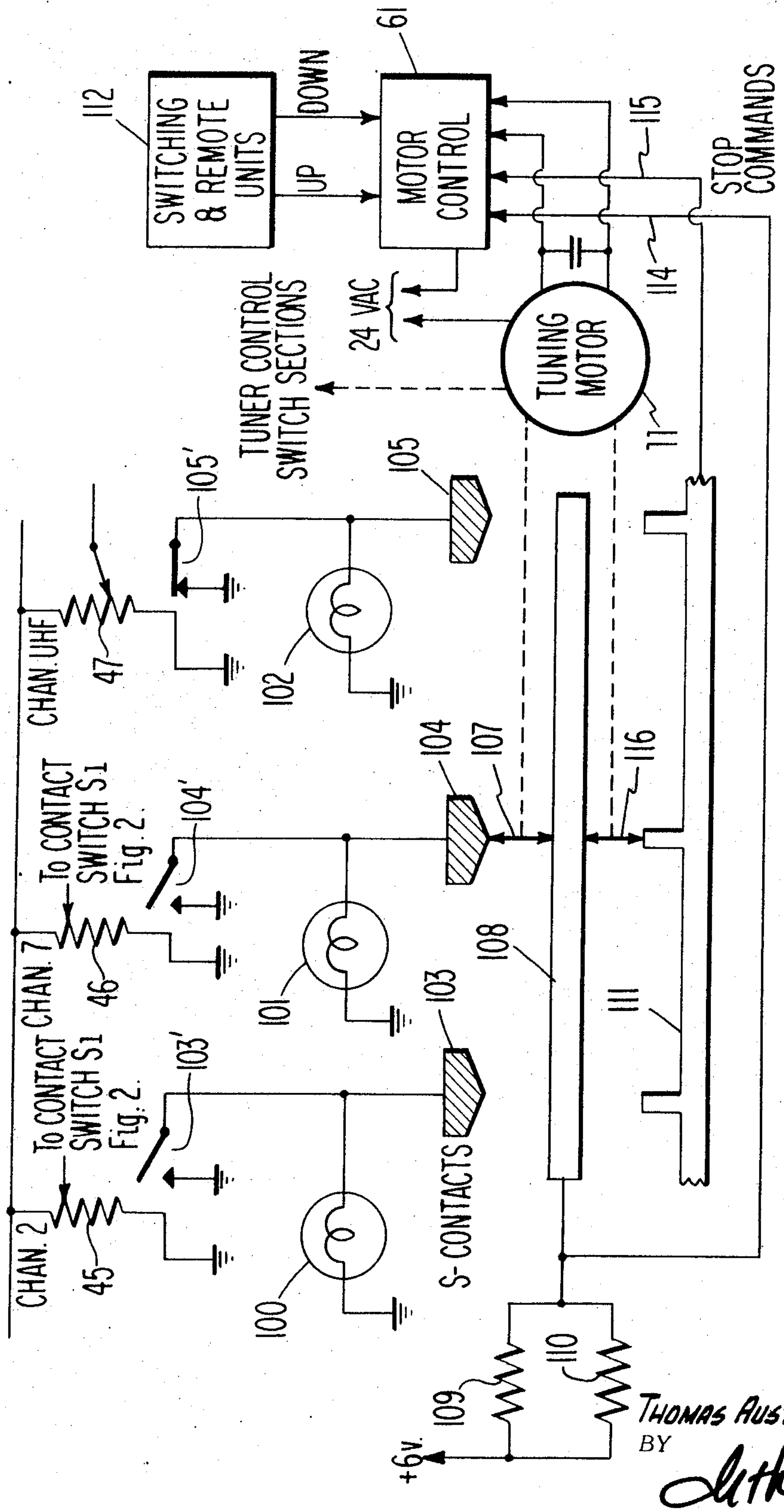
FIG. 4 is a schematic diagram partly in block form showing switching control of the bidirectional motor and channel indication operation.

Referring to FIG. 4, the operation of the tuning motor control system in further controlling the switches will be briefly described. The tuning motor 11 operates from a 24 volt AC supply which is furnished by means of a transformer located in the television chassis 26 of FIG. 1. The motor control assembly 61 will be described in greater detail subsequently.

Presently it is sufficient to state that a ground applied momentarily either to the up or down input leads of the motor control unit 61 will cause the motor 11 to start, and a suitable control signal applied to leads 114 and 115 associated with the motor control module 61 will cause the motor to stop. It will be seen that the direction of the motor rotation is determined by which input to the motor control module 61 is accessed.

As indicated in FIG. 4, the system is tuned to channel 7, evidence by the arm 17 as controlled by the motor being connected to the contact 104. Contact 104 serves to connect the arm 107 to a terminal of an indicator lamp 101 associated with contact 104.

The channel 7 potentiometer 46 is also shown in this figure and corresponds to that potentiometer shown in FIG. 2.

To simplify the explanation, the same potentiometers as shown in FIG. 2 as 45, 46 and 47 have been designated by the same reference numerals and channel indications as 2, 7 and UHF.

Each potentiometer 45–47 is associated with a switch 103', 104' and 105', respectively. These switches will close when the potentiometer is set at one of its extreme positions. This action is shown schematically with reference to potentiometer 47 having an arm positioned at one extreme end causing the closure of associated switch 105'. Each potentiometer 45–47 is further associated with an indicator lamp as 100 to 102, which lamps, as indicated above, are illumimated when the receiver is at rest at a preselected channel position. Thus, for the setup shown in FIG. 4, lamp 101 would be energized giving the user of the receiver an indication that channel 7 has been selected.

The arm 107 serves to connect the contact 104 to the switch bus or ring 108, which has connected to one end the parallel combination of resistors 109 and 110. The other terminal of the parallel combination is coupled to a +6 volts supply. A further detent switch 111 is coupled to the bus 108 by means of another switch arm 116 also under control of the motor operation. The bus 111 is coupled to lead 115 associated with the stop command input to the motor control circuit 61. A further motor control input is obtained at the junction between resistors 109 and 110 and the bus 108.

As is shown in FIG. 4, the system is at rest on channel 7. Channels 2 and 7 are programmed to be selected. The UHF channel is programed to be skipped due to the fact that the tuning potentiometer 47 is rotated to the extreme limit. The switch 105' associated with the potentiometer 47 is closed. This programs that the particular UHF channel is to be skipped or ignored by the circuitry, as will be explained.

If the up control lead coupled to the motor control 61 is grounded, the tuning motor 11 begins to operate to turn a shaft. A positive potential which is normally coupled to bus 111 is removed as soon as the motor starts. Without a positive input at lead 115 of the motor control circuit, the motor continues to run until the switch arms 107 and 116 reach the contacts for the next channel. If this channel is programmed to be skipped as the UHF channel shown in FIG. 4, the stop command input to the motor control module 61 remains as zero and the motor shaft continues turning until an active channel is reached.

For example, the last position shown was afforded by the fact that channel 7 was a preselected channel and the switch 104' was open. When the contact 107 reached the position shown, the +6 volts obtained through resistors 109 and 110 served to illuminate the lamp 101 and therefore a fairly large positive voltage appeared at the junction between bus 108 and the aforementioned resistors. This positive voltage impressed upon leads 114 and 115 caused the motor to stop. Now as soon as a new up command is initiated the motor 11 starts again; the motor will commence rotation, thus moving contacts 107 and 116 to the next contact pair including contact 105. As soon as the arm 107 is between the bus 108 and contact 105, the shorted indicator 107 causes the voltage at that aforementioned junction to go towards ground. This ground is not sufficient to stop the motor and therefore the motor continues operation until it reaches the next preselected channel associated with similar circuitry. If the associated switch as 105' were not closed, then the voltage at the junction between the resistors 109 and 110 and bus 108 will again be positive and thus cause the motor to again stop.

Referring to FIG. 5, there is shown a detailed block diagram of the motor control unit. The up and down switches as 21 and 22 of FIG. 1, including the up and down control functions from the remote control, are impressed respectively upon the cathodes of diodes 120 and 121. The anodes of these diodes are coupled to a start delay network 122 which serves to delay the pulse by means of an integration to thereby suppress noise and so on from falsely triggering a one-shot or monostable multivibrator 123. The multivibrator 123 produces a pulse of a predetermined width, which pulse is processed by the start switch 124 and serves to trigger the start-stop flip-flop 125 into the start mode. When the flip-flop is thus triggered into the start mode, the output lead designated as muting is coupled to the audio amplifier and video amplifier of the television chassis to cut off the video amplifier to thereby produce a dark raster on the screen of a kinescope display, not shown, and to simultaneously prevent sound from being produced by the audio amplifier. The output of the start-stop flip-flop 125 is also coupled to the motor switch driver 129 which serves to activate the up motor switch 130 or the down motor switch 131 to thereby control the motor. The up motor switch 130 and the down motor switch 131 are controlled from the up button and down switches as well.

As shown in the figure, the up switch lead and the down switch lead are respectively connected to the cathodes of diodes 119 and 118. The anodes of these diodes are coupled to input electrodes of the up-down flip-flop 126. If the up mode lead was energized, the flip-flop 126 would be set in the up mode direction. The output of the flip-flop 126 would energize the up driver 127 which would serve to energize the up motor switch 130. The up motor switch 130 would apply a ground to the suitable winding of the tuning motor 132. This would cause the tuning motor to run in the up channel direction (as from channel 2 to 13) which, for example, may be the clockwise direction. The motor is thereby energized upon the receipt of the double condition, namely, the energization of the up motor switch 130 coupled with the energization of the motor driver switch 129.

Similarly, the down channel mode is accessed by a diode 118 which sets flip-flop 126 in its other state or down state. The setting of the flip-flop 126 in this mode enables the down driver 128 which serves to apply energizing potential to the down motor switch 131. The combination of the energization of the down motor switch 131 and the motor driver switch 129 serves to energize the opposite winding of the motor to cause the motor to operate, for example, in the counterclockwise position. As indicated from the schematic, 24 volts AC is the source utilized to drive this particular motor. Also shown is that the setting of the start flip-flop 125 serves to mute the TV chassis as described and further serves to disable the automatic frequency control circuit via diode 133 whose cathode is coupled to the base electrode of transistor 82 shown in FIG. 3. The diodes 133 and 134 receive the stop commands from the suitable switch circuitry as described above. Therefore, if the correct channel has been accessed, a positive potential through diode 134 serves to reset the start-stop flip-flop 125 to the stop mode. This action removes muting and AFC disable and causes the motor to stop by de-energizing the motor switch driver.

Referring to FIGS. 6a and 6b, there is shown a circuit diagram of the block arrangement of FIG. 5. A ground on the up diode 120 or the down diode 121 causes capacitor 137 to charge through resistor 150 and the associated diode. As the capacitor begins charging, the base of the transistor 138 goes more negative, thus turning transistor 138 on. As transistor 138 conducts, the voltage at the collector electrode becomes positive, which in turn turns on transistor 140 via resistor 139. Transistor 140 forms a monostable multivibrator with transistor 144. The initial quiescent conditions are to cause transistor 144 to conduct because of the DC coupling afforded by resistor 142. Transistor 140 is thereby rendered nonconductive.

However, as the voltage in the base electrode of transistor 140 increases, transistor 140 begins to conduct. The voltage at the collector goes negative, thereby turning off transistor 144. The circuit will revert back to its stable state after capacitor 143 discharges sufficiently to allow transistor 144 to again conduct. The ground required at the input to permit conduction to take place is approximately for 100 millisecond period and is determined by the R-C time constant afforded by capacitors 137 and 150. As indicated above, this is selected to prevent spurious signals and switch bounce from falsely activating the multivibrator circuit. Thus a relatively fixed pulse is available at the collector electrode of transistor 144. This pulse is applied via resistor 145 and 146 to the base electrode of transistor 147. The positive pulse causes transistor 147 to conduct. Conduction of transistor 147 causes the voltage at the base electrode of transistor 148 to go negative. This negative voltage causes transistor 148 to go towards cut off. Transistors 148 and 151 form a bistable multivibrator with DC cross-coupling between the collector of one transistor and the base of the other.

Since transistor 148 is cut off, the collector voltage goes positive, causing transistor 151 to turn on. This is a stable state and transistor 151 will remain turned on until the bistable multivibrator is triggered back via diode and 153. During the time transistor 148 is cut off, the positive voltage at the collector electrode is applied to mute either both or one of the video and audio circuits of the television chassis and to disable the AFC control voltage through diode 156. Transistor 157 is brought into saturation. When transistor 157 is saturated, the low impedance from the collector-to-emitter path thereof serves to effectively ground the emitter electrodes of transistors 160, 161, 162 and 163, which are arranged in a bridge connection.

The collector electrodes of transistors 162 and 163 are respectively coupled across a starting capacitor 164, which has one terminal coupled to a terminal of the winding 165 of the tuning motor 170 and the other terminal coupled to a terminal of another winding 164 of the tuning motor. The tuning motor, as indicated above, operates from a 24 volt AC supply furnished from a transformer located on a television chassis.

One side of the 24 volt supply is directly coupled to the junction between windings 164 and 165, while the other side of the 24 volt supply is coupled to the collector electrodes of transistors 160 and 161 respectively. The circuit arrangement including transistors 160–163 is basically a switching circuit which will drive the motor during the presence of two signal conditions.

The first condition, as indicated, is the saturation of transistor 157 which, for example, causes the emitter electrodes of transistors 160–163 to go towards ground potential via the collector resistor 168 and diodes 166 and 167, which are coupled to the collector electrode of transistor 157. The second condition is determined by whether or not an up or down command was initiated.

As indicated above, the up and down control leads which are coupled to the start delay circuit 122 are also coupled to the up-down flip-flop or bistable multivibrator 126. For example, the up lead is coupled via resistor 167 to the cathode of diode 168. Alternatively, the down lead is coupled through resistor 169 to the cathode of diode 170. Diodes 168 and 170 serve to set the bistable multivibrator in any one of its two stable states.

Basically, the bistable multivibrator is a conventional design comprising transistors 171 and 172 having their emitters coupled together and returned to the point of reference potential through a resistor 173. The collector of transistor 172 is coupled via a resistor 174 and a diode 175 to the base electrode of transistor 171, while the collector electrode of transistor 171 is coupled to the base electrode of transistor 172 via resistor 176 in series with the diode 177.

Impressing a ground on either the up or the down lead causes the diode 168 to commence conduction. For example, assume that transistor 172 is initially nonconductive. This means that the collector potential of transistor 172 is at a high positive level. This high positive level is coupled to the base electrode of transistor 171 via resistor 174 and diode 175, thus assuring that transistor 171 is conducting and therefore its collector electrode is at low potential, which results in transistor 172 being nonconductive.

Now assume that the up command switch is accessed, thereby placing a ground on the up command lead. The cathode of diode 168 is grounded and diode 168 conducts. The conduction of diode 168 diverts current from diode 175. Since transistor 171 has no base current, it ceases conduction and hence the collector voltage goes towards +30 volts, which transition is coupled through resistor 176 and diode 177 to reverse the state of the flip-flop and thereby causing transistor 172 to go into saturation.

The potential at the collector of transistor 172 thereby goes from +30 volts to a few volts positive. The negative transition at the collector of transistor 172 is coupled to the base electrode of transistor 178 which becomes saturated. The saturation of transistor 178 causes the collector potential to go positive, thereby forward biasing transistors 161 and 163 through diodes 179 and 180, thus forming an AC return path for the 24 volt supply through transistors 161, 163 and winding 164. This winding 164 is now energized by the 24 volt supply causing the motor to run in the up direction.

Similarly, if the up-down flip-flop were activated by the down command to its other state, transistor 180 would be energized due to the low potential drop at the collector of transistor 171. This would, in turn, cause transistors 160 and 162 to be forward biased due to the application of the positive potential to their base electrodes via diodes 181 and 182. In this mode the 24 volt supply would be returned via transistors 160 and 162 through the motor winding 165 to thereby cause the motor to run in the opposite direction or down direction.

As soon as a program channel is accessed, the diode 153 receives a positive voltage from the switch module, as described in FIG. 4. This positive potential serves to saturate transistor 148 and thereby cut off transistor 157 to thereby disable the emitter returns for transistors 160–163. This then causes the motor to stop at that selected channel. The diode 152 is coupled to the junction between resistors 109 and 110 and bus 108 of FIG. 4. Diode 152 is included to prevent spurious signals from falsely resetting the transistor 148 due to voltage fluctuation caused during switch activation.

When a lamp is shorted out, the voltage at the cathode of diode 152 goes to ground for that channel. This causes a diversion of base current from transistor 148 causing transistor 148 to remain in the cut off state, thus enabling the motor to continue to run. Therefore, diode 152 further operates to assure that the transistor 148 will remain nonconductive even though the voltage applied is not exactly at ground potential when a "channel skip" operation is programmed.

From the above description, it can be seen that control is afforded the tuner by means of the motor and the associated potentiometers for setting quiescent voltage levels for the electronic variable reactance devices included in both the UHF and VHF tuners. It is also seen that various disabling modes, as well as a motor stop mode, are available through the switch arrangement. Basically, if one were to consider the switching problems as described above, it would appear that the switches or switch utilized would have to be a relatively complicated device.

Referring to FIGS. 7 and 8, a more detailed description of the switch operation and functions will be given.

FIG. 7A shows a rotary switch which includes all the aforementioned switch and switch contacts and is fabricated on a phenolic board 300 as a printed circuit assembly. The switch as shown is not drawn to scale, but includes the various contacts and assemblies as will be described.

Basically, the switch includes a plurality of deposited copper contacts and associated deposited copper slip rings which are arranged in a circular fashion to enable bidirectional switching control from the motor. A series of contacts are shown and designated as the $S_{3d}$ contacts. These contacts are those contacts $S_{3d}$ shown in FIG. 8 which are 20 in number. Each of the $S_{3d}$ contacts goes to an associated potentiometer, which as explained above (FIG. 2), are set to provide a control voltage for a preselected channel. The $S_{3d}$ switch includes an associated slip ring ($S_{3d}$ ring) which is an annular copper structure deposited in close proximity to the $S_{3d}$ contacts. The $S_{3d}$ contacts and the $S_{3d}$ ring are connected together by means of the moveable arm 210 shown superimposed upon the rotary switch assembly and also shown in the side view of FIG. 7B.

As can be seen, the rotary arm 210 contains a shorting bar 211 which serves to short any one of the $S_{3d}$ contacts to the $S_{3d}$ ring, thus making a connection as shown in FIG. 8, for example. This rotary arm 210 accounts for the schematically shown variable arms associated with the various switch assemblies. The rotary arm 210 is coupled by means of a shaft to the motor and is rotatably driven thereby. The $S_{3d}$ ring is connected to the tuning bus of the VHF and UHF tuner assemblies 24 and 25 and enables correct tuning of the varactor devices located therein. Directly beneath the $S_{3d}$ ring is another series of contacts designated as the $S_{1b}$ contacts. These contacts are also shown schematically in FIG. 8 and are those contacts which are coupled to the indicator lamp assemblies. The $S_{1b}$ contacts are also 20 in number, and supply 20 indicator lamps to enable indication of 20 unique channels.

Each indicator lamp as 202 and 203 (FIG. 8) is associated with a corresponding switch as 204 and 205. These are the switches which, as was explained (FIG. 4), serve to short out the lamps for the lower position of the potentiometer, thus enabling the motor to skip that channel. A voltage source for operating the lamps is derived from the +V supply via a resistor 207 which is connected to the variable arm 208 associated with the $S_{1b}$ contacts. The variable arm 208 of FIG. 8 is in essence provided by another slip ring designated in FIG. 7A as the $S_{1b}$ ring, which accesses the $S_{1b}$ contacts under control of the rotary arm 210. This slip ring in conjunction with the shorting bar 212 has a positive voltage supplied thereto for energizing an indicator and under control of the rotary arm 210. The connection between the variable arm 208 and resistor 207 is also coupled to another slip ring associated with the S4 switch.

Referring to FIGS. 7A and 8, the S4 switch is a series of simulating detents which are coupled to the motor control module 211. These detents are selected to be relatively in the center of the $S_{1b}$ contacts associated with the indicator assemblies. These contacts serve to assure that the stopping of the motor takes place virtually in the center of the $S_{1b}$ contacts. This prevents shock or vibration of the television chassis from moving the switches off position. For example, if it were not for the detent arrangement, shown and designated as S4, the motor may stop with the switch positioned at an extreme edge of a contact. Thereafter any subsequent vibration could cause the assembly to be forced off the contact to a position between contacts and, hence, the consumer would lose his picture.

A further set of contacts are designated as the $S_{1a}$ contacts. These contacts are associated with the $S_{1a}$ ring and are the aforementioned band select contacts (FIG. 2). The $S_{1a}$ contacts and associated ring therefore serve to set the tuner to the desired tuning band such as low, VHF, high VHF, or UHF. It should be apparent from referring to FIG. 7 that each of the contacts and the associated slip ring are connected together by means of the shorting sections 211, 212 and 213 associated with the $S_{1a}$, $S_{1b}$ and $S_{3d}$ contacts as described.

Referring to FIG. 8, there is shown a more detailed schematic diagram of the entire switching assembly described above in conjunction with the various control modules and including the exact nature of the tuning meter circuit whose operation will be described subsequently. FIG. 8 again shows the $S_{1b}$, the $S_{1a}$, the S4 and the $S_{3d}$ switches and their associated contacts and arms. These switching arrangements are shown schematically, whereas the exact nature of this switch construction has been explained in conjunction with FIG. 8.

Tuning and band selection are accomplished as follows. A particular band of frequencies is accessed by means of switching diodes located in the VHF tuner 24 for example. These switching diodes serve to activate the particular resonant circuits associated with that band (i.e., VHF low or high). In this manner a suitable potential impressed on the VHF high or low band leads via switch $S_{1a}$ serves to forward bias these switching diodes and therefore accesses the associated low or high band circuits.

Tuning within the band is accomplished by applying a proper potential on the tuning line, which serves to vary the reactance of variable reactance devices as varactor diodes included within the tuner and operative to effect the response of the resonant circuits associated with the band as selected by the switching diodes.

A brief summation of the tuning control assembly will now be given to further clarify the interaction and operation of the various components. As indicated, the $S_{1b}$ contacts are each connected to a separate indicator lamp as 202 and 203. The motor control circuit 211 is caused to operate in either its up or down positions as directed by an appropriate command from the switches or the remote unit assembly 220. As the motor 200 is caused to rotate, this causes the rotary switch arm 210 of FIG. 7B to rotate. As it rotates, it continues to short the associated slip ring to the associated contact. The $S_{1b}$ section therefore serves to indicate the channel by illuminating the associated indicator lamp. If the lamp is not shorted by means of the shorting switch, as 204 and 205, the motor will stop on that position due to the positive voltage obtained via resistor 207 and coupled to the S4 variable arm associated with the S4 contacts. This positive voltage places a disable input on the stop motor lead associated with the motor control circuit 211. Because of the detent arrangement of the S4 assembly, the motor will stop at the center of the contact; the associated lamp will be lit indicating the correct channel. The tuning voltage is preset by means of the potentiometers, each one associated with a separate contact of the $S_{3d}$ switch. The variable arm of the $S_{3d}$ switch goes to tuning bus associated with both the VHF and UHF tuners 24 and 25. The band select switch $S_{1a}$ is prewired so as to control the range of the tuning voltage by means of the circuitry associated with the meter control circuit to be explained. In this manner, the rotary switch as controlled by the motor 200 causes a channel to be selected, that channel indicated by means of the pilot light, and the correct tuning voltage applied to the tuner by means of the associated potentiometers. The control voltage module 221, as shown, supplies the tuning voltage to the parallel potentiometers and superimposes thereupon the AFC control voltage, as previously described in conjunction with FIG. 2.

Also indicated are the two types of AFC disabling which are applied to the voltage control circuit and which was explained.

Therefore, the relatively complicated but efficient switching control of the electronic variable tuners 24 and 25 is afforded by means of a relatively simple and inexpensive printed circuit switch as shown in FIG. 7. The only moving part associated with the printed circuit switch is the rotary switch arm 210 which is directly controlled by the motor 200. The direction, of course, can be clockwise or counterclockwise depending upon whether the up or the down modes of the motor control 211 have been accessed.

The meter circuit operates as follows. The lower set of contacts associated with $S_{1a}$ are generally designated as the 221 contacts and are representative of the low band VHF channels, namely, channels 2 to 6. The common lead emanating from the 221 contacts is coupled to the junction between diodes 222 and 223. A resistor 224 returns this lead to a point of reference potential. This positive voltage via switch $S_{1a}$ serves to reverse bias diode 222 and forward bias diode 223. The forward biased diode 223 provides a low impedance path to the VHF low tuning bus associated with the VHF tuner 24. The cathode of diode 223 is coupled to the VHF low band lead of the VHF tuner. The positive voltage on this lead via switch $S_{1a}$ causes switching diodes in the tuner to place the VHF low band circuitry in operation. The transistor 225 is cut off in this state. The diode 224 is also forward biased in this mode because of a low impedance path in the tuner and provides a path to any current derived from the tuning voltage. This current path is through the resistor 226, the meter 227 and the resistor 228 associated with the diode 224. This current path causes the meter 227 to provide an indication. Resistor 228 is then adjusted so that the meter reads channel 6 in this position which is in essence the high end of the VHF low band.

The next procedure necessary in order to align the meter is setting of the $S_{1a}$ switch to the next series of contacts generally designated as 230 and representative of the VHF high frequency band, which includes channels 7 to 13. In this position, the current path through the meter 227 is obtained via resistor 226, resistor 231, diode 222 and resistor 224. With switch $S_{1a}$ in the VHF high band position, the cathode of diode 223 is at about +15 volts due to tuner voltage and is reversed biased. Diode 224 is also reverse biased, thereby removing resistor 228 from the circuit. The transistor 225 is still cut off due to the open circuited base electrode. Resistor 231 is now adjusted so that the meter 227 will indicate channel 13 which corresponds to the highest reading for the VHF high band. The $S_{1a}$ switch is now set to the UHF position represented by the contacts 235 of switch $S_{1a}$. In this condition, both diodes 222 and 224, effectively in parallel, are both forward biased because of tuner voltages. Transistor 225 is now saturated due to the positive voltage impressed on its base electrode by means of the +V supply coupled to contacts 235 via the variable arm associated with switch $S_{1a}$. The resistor 226 which is part of the collector load for transistor 225 is now adjusted to indicate the particular UHF channel being tuned to by means of the associated potentiometer coupled to the contacts associated with switch $S_{3d}$.

In the above explanation it is noted that the VHF high and low bands are calibrated first, then the UHF channels are calibrated. In the UHF position the total meter current is determined by the current flow through resistors 228 and 231. The correct UHF reading is obtained on the meter by diverting a portion of the current through transistor 225 by adjusting resistor 226. Therefore, a single meter may be used to indicate both the VHF low and high bands and the UHF band. A typical way of doing this is to calibrate the meter to indicate all channels in the tuning range by having a first portion of the scale which may be equal to about half scale deflection to cover the low VHF band. The second or upper part of the meter scale is used to indicate the high VHF band. Finally, a third portion may utilize a different half or the right hand side of the meter scale to indicate UHF channels. In this way, by using the controls shown, one can utilize a single meter for indicating the three television bands and divert and control current as described above.

What is claimed is:

1. Apparatus for selectively stopping a motor at any one of a predetermined number of positions and further for providing an indication of which position said motor is stopped at, said motor having a winding, the energization of which causes said motor to operate, comprising:

a. a motor control circuit coupled to said winding for energizing the same to operate said motor, said motor control circuit having an inhibit input terminal which upon application thereto of a predetermined potential will cause said motor control circuit to de-energize said winding and stop said motor, b. a switch having a plurality of contacts each associated with a different one of said predetermined number of positions, c. said switch having a variable arm which can be moved to contact any desired one of said contacts, said variable arm of said switch being coupled to said motor for movement of the same according to the operation of said motor;

a d. a of indicating devices each one associated with and coupled to a separate one of said contacts, said devices adapted to receive an energizing potential to provide an indication, e. first means coupled to said variable arm adapted to receive a source of potential to cause said indicating device associated with said contact to provide said indication when said source is applied thereto via said variable arm, f. second means coupling said variable arm of said switch to said inhibiting terminal of said motor control circuit for inhibiting said motor control circuit and stopping said motor when said potential at said variable arm is substantially equal to said indicating device's energizing potential.

2. The apparatus according to claim 1 further comprising:

a. a plurality of separate means each one in shunt with a separate one of said indicating devices for selectively shorting out any desired one of said indicating devices to therefore cause the potential at said variable arm when said arm is connected to said indicating device, to be insufficient to inhibit said motor control circuit, thereby causing said motor to continue operation.

3. Apparatus for automatically controlling the tuning of a television receiver of the type employing a radio frequency amplifier which may be tuned to any one of a plurality of transmitted radio frequency waves in accordance with the magnitude of a control voltage applied thereto and necessary to vary the reactance of a variable reactance device associated with said tuner for selecting a frequency corresponding to said any one radio frequency wave, comprising:

a. a motor having a shaft coupled thereto and capable of operating in a first or second rotational direction upon the application to said motor of a suitable control potential, b. motor control means coupled to said motor and capable of operating in a first mode for controlling said motor in said first direction and in a second mode for controlling said motor in said second direction, said motor control means further having an inhibit input terminal responsive to a signal for stopping said motor, c. a plurality of potentiometers each adapted to receive at one terminal thereof a predetermined source of potential, each of said potentiometers capable of being adjusted to provide a different control voltage which when applied to said radio frequency amplifier will cause the same to tune to a different one of said transmitted radio frequency waves, d. first switching means having a plurality of first contacts each one of which is solely associated with a different one of said potentiometers, said switching means having a first common arm controlled by said motor for rotation therewith, whereby any one of said potentiometers and said associated control voltage may be accessed, e. means coupling said first plurality of contacts to said radio frequency amplifier means to control the tuning thereof according to any one of said different control voltages, f. and means coupled to said inhibiting input of said motor control means responsive to the access of one of said potentiometers providing said associated control voltage for inhibiting said control means and therefore stopping said motor to cause said radio frequency amplifier to provide said selected frequency.

4. The apparatus according to claim 3 further including:

a. second switch means having a second plurality of contacts of the same number as said first and each one of which is associated with a separate one of said first contacts, said second switching means having a second common arm controlled by said motor for rotation therewith in synchronism with said first common arm, b. a plurality of indicating devices each one of which is associated with one of said second contacts for providing an indication of the frequency tuned to when said motor is stopped.

5. Apparatus for automatically controlling the tuning of a television receiver of the type employing a radio frequency amplifier which may be tuned to any one of a plurality of transmitted radio frequency waves in accordance with the magnitude of a control voltage applied thereto and necessary to vary the reactance of a variable reactance device associated with said tuner for selecting a frequency corresponding to said any one radio frequency wave, comprising:

a. a motor having a shaft coupled thereto and capable of being operated in a first or second rotational direction upon the application to said motor of a suitable control potential, b. motor control means coupled to said motor and capable of operating in a first mode for controlling said motor in said first direction and in a second mode for controlling said motor in said second direction, said motor control means further having an inhibit input terminal responsive to the application of a predetermined signal for stopping said motor, c. a plurality of potentiometers each adapted to receive at one terminal thereof a predetermined source of potential, each of said potentiometers capable of being adjusted to provide a different control voltage each of which when applied to said radio frequency amplifier will cause the same to tune to a different one of said transmitted radio frequency waves in accordance with the magnitude of said different control voltage, d. first switching means having a plurality of first contacts, each one of which is solely associated with one of said potentiometers, said switching means having a first common arm controlled by said motor for rotation therewith, whereby any one of said potentiometers and said associated control voltage may be accessed, e. second switching means having a plurality of second contacts equal in number to said first contacts and each separate one being associated with a separate one of said first contacts, said second switching means having a second common arm controlled by said motor and in synchronism with said first arm, f. means for coupling certain selected ones of said second plurality of contacts associated with certain selected ones of said first contacts together for indicating a range of control voltages for said associated potentiometers indicative of a range of frequencies to be tuned to, g. means coupling said first plurality of contacts to said radio frequency amplifier to control the tuning thereof according to any one of said different control voltages, h. channel indicator means, i. means coupling said second plurality of contacts to said channel indicator means for controlling the indication thereof according to said range of frequencies, and j. means coupled to said inhibiting input of said motor control means responsive to the access of one of said potentiometers providing said associated control voltage for inhibiting said control means and therefore stopping said motor to cause said radio frequency amplifier to provide said selected frequency.

6. The apparatus according to claim 5 wherein said first switch means comprises, a. a circuit board having a plurality of copper areas deposited thereon and arranged about the circumference of a circle having a given diameter, each of said copper areas being insulated from the next and having a number equal to the number of said first plurality of contacts, b. a second copper path deposited on said board and having the shape of an annular ring, said second copper path being in close proximity to but isolated from said first copper areas, c. a rotatable member having a first conductive area of a dimension large enough to connect any of said first copper areas to said second copper path, d. means coupling said rotatable member to said motor for rotating the same while causing said conductive area to sequentially connect each of said copper areas to said second copper path, and e. means coupling said second copper path to said radio frequency amplifier.

7. The apparatus according to claim 5 further comprising:

a. automatic frequency control means responsive to said selected frequency for providing a control voltage at an output terminal indicative of a deviation of said frequency from said selected value, b. means coupling said output terminal of said automatic frequency control means to said one terminal of said potentiometers.

8. The apparatus according to claim 5 further including:

a plurality of third contacts deposited on said printed circuit board each one of which is associated with preselected ones of said plurality of first contacts and having a third common arm controlled by said motor for rotation therewith in synchronism with said first and second common arms, a plurality of tuner band switching control terminals each one of which is associated with one of said third contacts, and means coupling said third common arm to a source of operating potential.

* * * * *